United States Patent
Nawano

(10) Patent No.: US 8,345,461 B2
(45) Date of Patent: Jan. 1, 2013

(54) FERROELECTRIC CAPACITOR AND ITS MANUFACTURING METHOD

(75) Inventor: Masahisa Nawano, Suwa (JP)

(73) Assignee: Seiko Epson Corporation (JP)

(*) Notice: Subject to any disclaimer, the term of this patent is extended or adjusted under 35 U.S.C. 154(b) by 931 days.

(21) Appl. No.: 12/045,135

(22) Filed: Mar. 10, 2008

(65) Prior Publication Data
US 2008/0225569 A1    Sep. 18, 2008

(30) Foreign Application Priority Data
Mar. 14, 2007   (JP) .................................. 2007-064596

(51) Int. Cl.
*G11C 11/22* (2006.01)
(52) U.S. Cl. .............................. 365/145; 257/295; 438/3
(58) Field of Classification Search .................. 257/295, 257/E27.104, E21.663, E21.664; 365/145; 438/3
See application file for complete search history.

(56) References Cited

U.S. PATENT DOCUMENTS

| 5,831,299 | A | * | 11/1998 | Yokoyama et al. | 257/295 |
| 5,998,819 | A | * | 12/1999 | Yokoyama et al. | 257/295 |
| 6,172,385 | B1 | * | 1/2001 | Duncombe et al. | 257/295 |
| 6,586,790 | B2 | | 7/2003 | Kanaya et al. | |
| 6,922,351 | B2 | * | 7/2005 | Natori et al. | 365/145 |
| 6,940,741 | B2 | * | 9/2005 | Saito et al. | 365/145 |
| 6,982,444 | B2 | | 1/2006 | Kanaya et al. | |
| 2006/0017086 | A1 | | 1/2006 | Kanaya et al. | |
| 2006/0275930 | A1 | | 12/2006 | Kijima | |

FOREIGN PATENT DOCUMENTS

| JP | 2000-040799 | 2/2000 |
| JP | 2000-174228 | 6/2000 |
| JP | 2003-021835 | 1/2003 |
| JP | 2006-339420 | 12/2006 |

* cited by examiner

*Primary Examiner* — Son Dinh
(74) *Attorney, Agent, or Firm* — Harness, Dickey & Pierce, P.L.C.

(57) ABSTRACT

A ferroelectric capacitor includes: a ferroelectric film, and a lower electrode and an upper electrode interposing the ferroelectric film, wherein the ferroelectric film includes a first ferroelectric layer of ferroelectric material having a perovskite type crystal structure expressed by a general formula $ABO_3$ formed by a metal organic chemical vapor deposition method, a second ferroelectric layer of ferroelectric material in which a part of B site element in ferroelectric material having a perovskite type crystal structure expressed by a general formula $ABO_3$ is replaced with Nb, and a third ferroelectric layer of ferroelectric material having a perovskite type crystal structure expressed by a general formula $ABO_3$ formed by a sol-gel method, which are sequentially laminated from the side of the lower electrode.

4 Claims, 3 Drawing Sheets

FERROELECTRIC CAPACITOR AND ITS MANUFACTURING METHOD

The entire disclosure of Japanese Patent Application No. 2007-064596, filed Mar. 14, 2007 is expressly incorporated by reference herein.

BACKGROUND

1. Technical Field

The present invention relates to ferroelectric capacitors and methods for manufacturing the same.

2. Related Art

Ferroelectric memory devices (FeRAM) are nonvolatile memory devices capable of low voltage and high-speed operation, using spontaneous polarization of the ferroelectric material, and their memory cells can be each formed from one transistor and one capacitor (1T/1C). Accordingly, ferroelectric memory devices can achieve integration at the same level of that of DRAM, and are therefore expected as large-capacity nonvolatile memories.

As the material for forming the ferroelectric film that composes the ferroelectric capacitor, in other words, as the ferroelectric material, a material having a perovskite type crystal structure expressed by a general formula $ABO_3$, more specifically, lead zirconate titanate (Pb (Zi, Ti) $O_3$: PZT) may generally be used.

For the next generation ferroelectric memories, it is desired to form ferroelectric films by a MOCVD (metal organic chemical vapor deposition) method. This is because the conventional sputter method cannot form ferroelectric films with satisfactory crystal orientation characteristic, and good ferroelectric characteristic cannot be obtained, while ferroelectric films with good crystal orientation characteristic are desired.

Japanese Laid-open Patent Application JP-A-2003-21835 proposes a method as a technology to meet such demands. This technology pertains to a method in which a first ferroelectric film in amorphous phase is crystallized, and then a second ferroelectric film in crystalline phase is deposited on the top surface of the first ferroelectric film, wherein the second ferroelectric film is deposited and formed by a MOCVD method.

However, the inventors have diligently studied ferroelectric films formed by the aforementioned MOCVD method, and discovered that ferroelectric capacitors obtained through forming a film of PZT by the MOCVD method to form a ferroelectric film had defects with considerable leakage current. Although the cause of this considerable leakage current is not clear, it is believed that this may be caused by roughened morphology of the PZT film formed by the MOCVD method. It is believed that the morphology roughness may be generated due to the formation of roughness in the surface of the PZT film because partially heterogeneous crystal surfaces are exposed in the surface of the PZT film formed by the MOCVD method, and the portions with the exposed heterogeneous crystal surfaces form protrusions.

SUMMARY

In accordance with an advantage of some aspects of the invention, ferroelectric capacitors with reduced leakage current and having ferroelectric films with better crystal orientation are provided, and methods for manufacturing the ferroelectric capacitors are also provided.

The inventors noticed that, by covering a surface of a PZT film formed by a MOCVD method with a second ferroelectric layer formed by a sol-gel method, surface roughness (morphology roughness) of the PZT film caused by the MOCVD method was not reflected on the surface of the second ferroelectric layer, and therefore the surface of the ferroelectric film composed of the PZT film and the second ferroelectric layer became smooth.

However, it was also found that, when the same PZT as that of the PZT film formed by the MOCVD method is used as the material for forming the second ferroelectric layer by the sol-gel method, the inversion charge (Qsw) became larger and the ferroelectric characteristic was improved, but paths of current leakage were formed at the interface between the PZT film formed by the MOCVD method and the PZT film formed by the sol-gel method, such that leakage currents were not sufficiently reduced. It was also found that, when PZTN (Pb (Zi, Ti, Nb) $O_3$) in which a part of Zr or Ti in PZT is replaced with Nb was used as the material for forming the second ferroelectric layer, instead of PZT, leakage currents could be reduced, but on the other hand, the inversion charge (Qsw) became smaller, and the ferroelectric characteristic also became deteriorated. Based of the knowledge described above, the inventors have made further studies, and completed the invention.

A ferroelectric capacitor in accordance with an embodiment of the invention pertains to a ferroelectric capacitor having a ferroelectric film, and a lower electrode and an upper electrode interposing the ferroelectric film, wherein the ferroelectric film is formed from a first ferroelectric layer of ferroelectric material having a perovskite type crystal structure expressed by a general formula $ABO_3$ formed by a metal organic chemical vapor deposition method, a second ferroelectric layer of ferroelectric material in which a part of a B site element in ferroelectric material having a perovskite type crystal structure expressed by a general formula $ABO_3$ is replaced with Nb, and a third ferroelectric layer of ferroelectric material having a perovskite type crystal structure expressed by a general formula $ABO_3$ formed by a sol-gel method, which are sequentially laminated from the side of the lower electrode.

According to the ferroelectric capacitor, the second ferroelectric layer composed of, for example, PZTN is formed on the first ferroelectric layer that is formed by a metal organic chemical vapor deposition method (MOCVD method), and the third ferroelectric layer formed by a sol-gel method is further laminated on the second ferroelectric layer, whereby the ferroelectric film is formed. Therefore, even when roughness (morphology roughness) is formed in the surface of the first ferroelectric layer, the surface thereof, in other words, the surface of the ferroelectric film does not form roughness and becomes smooth due to the third ferroelectric layer formed by a sol-gel method, whereby leakage current that may originate from morphology roughness is reduced. Furthermore, the second ferroelectric layer composed of PZTN with few leakage current is formed between the first ferroelectric layer and the third ferroelectric layer, such that current leakage paths at the interface between the first ferroelectric layer formed by a MOCVD method and the third ferroelectric layer formed by a sol-gel method are embedded by the second ferroelectric layer, whereby leakage currents are reduced.

Moreover, because the first ferroelectric layer is formed by a MOCVD method, the second ferroelectric layer and the third ferroelectric layer formed above the first ferroelectric layer have excellent crystal orientation, like the first ferroelectric layer, as the crystal orientation of their respective base layers is reflected in each of the layers, and thus the entire ferroelectric film has favorable crystal orientation, whereby the characteristic of ferroelectric capacitor having the ferroelectric film is improved.

In the ferroelectric capacitor described above, the second ferroelectric layer may be composed of ferroelectric material in which the B site element in the ferroelectric material expressed by a general formula $ABO_3$ may preferably be replaced with Nb by 10% or more but 50% or less.

When the B site elements is replaced with Nb by 10% or more in element ratio, the effect of reducing leakage current that is caused by the replacement with Nb is sufficiently exhibited. Also, as the replacement is 50% or less, the deterioration of ferroelectric characteristic that may be caused by a reduction in the inversion charge (Qsw) can be suppressed.

Also, in the ferroelectric capacitor, the first ferroelectric layer may be composed of lead zirconate titanate (PZT), the second ferroelectric layer may be composed of material (PZTN) in which a part of titanium or zirconium in lead zirconate titanate is replaced with niobate, and the third ferroelectric layer may be composed of lead zirconate titanate (PZT). As a result, the ferroelectric characteristic of the ferroelectric film is improved, and the ferroelectric capacitor is provided with excellent ferroelectric characteristic.

A method for manufacturing a ferroelectric capacitor in accordance with an embodiment of the invention pertains to a method for manufacturing a ferroelectric capacitor having a ferroelectric film, and a lower electrode and an upper electrode interposing the ferroelectric film, and the step of forming the ferroelectric film includes the steps of: forming, on the lower electrode, a first ferroelectric layer of ferroelectric material having a perovskite type crystal structure expressed by a general formula $ABO_3$ by a metal organic chemical vapor deposition method; forming, on the first ferroelectric layer, a second ferroelectric layer of ferroelectric material in which a part of a B site element in the ferroelectric material having a perovskite type crystal structure expressed by a general formula $ABO_3$ is replaced with Nb; and forming, on the second ferroelectric layer, a third ferroelectric layer of ferroelectric material having a perovskite type crystal structure expressed by a general formula $ABO_3$ by a sol-gel method.

According to the method for manufacturing a ferroelectric capacitor described above, the second ferroelectric layer composed of, for example, PZTN is formed on the first ferroelectric layer that is formed by a MOCVD method, and the third ferroelectric layer formed by a sol-gel method is further laminated on the second ferroelectric layer, whereby the ferroelectric film is formed. Therefore, as described above, even when roughness (morphology roughness) is formed on the surface of the first ferroelectric layer, the surface of the ferroelectric film can be made smooth by the third ferroelectric layer that is formed by a sol-gel method, whereby leakage current that may originate from morphology roughness can be reduced. Furthermore, the second ferroelectric layer composed of PZTN with few leakage current is formed between the first ferroelectric layer and the third ferroelectric layer, such that current leakage paths at the interface between the first ferroelectric layer by a MOCVD method and the third ferroelectric layer formed by a sol-gel method are embedded by the second ferroelectric layer, whereby leakage currents can be reduced.

Moreover, because the first ferroelectric layer is formed by a MOCVD method, the second ferroelectric layer and the third ferroelectric layer formed above the first ferroelectric layer have favorable crystal orientation, like the first ferroelectric layer, as the crystal orientation of their respective base layer is reflected in each of the layers, and thus the entire ferroelectric film can be provided with favorable crystal orientation, whereby the characteristic of ferroelectric capacitor having the ferroelectric film can be improved.

DESCRIPTION OF EXEMPLARY EMBODIMENTS

The invention is described below in detail. First, a ferroelectric capacitor in accordance with an embodiment of the invention is described with reference to the accompanying drawings. It is noted that, in each of the figures used for describing the invention, the scale of each of the members is appropriately changed to have a size that can be visually recognized.

Figure 1:
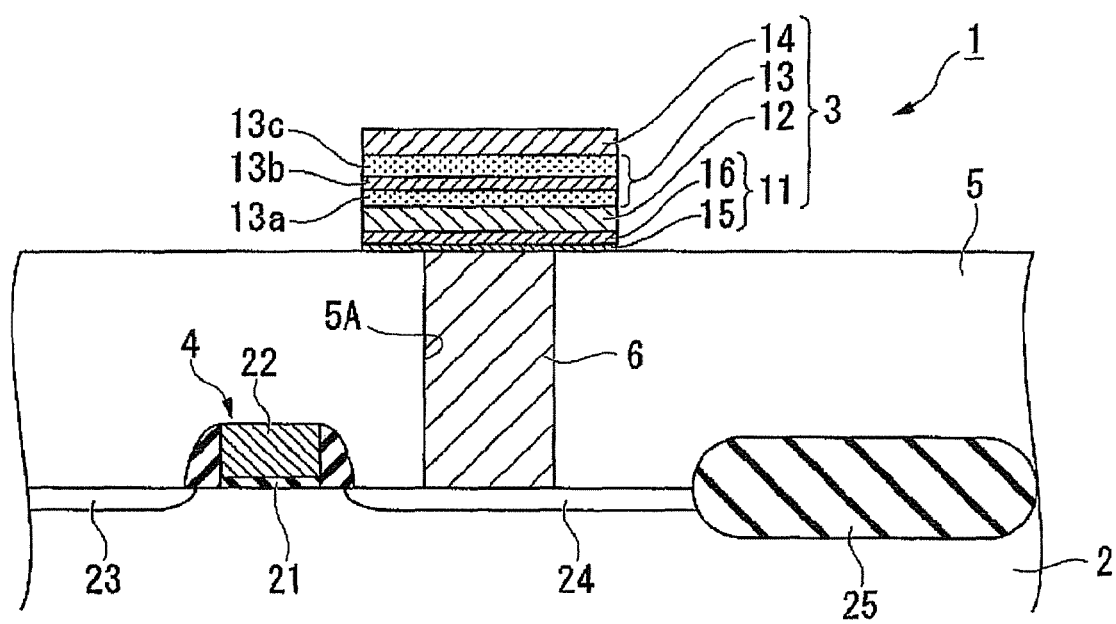
FIG. 1 is a schematic cross-sectional view showing a ferroelectric memory device in accordance with an embodiment of the invention.

FIG. 1 is a schematic cross-sectional view in enlargement of a ferroelectric memory device in a stacked structure that is equipped with a ferroelectric capacitor in accordance with an embodiment. Reference numeral 1 in FIG. 1 denotes the ferroelectric memory device, and reference numeral 3 denotes the ferroelectric capacitor.

The ferroelectric memory device 1 is equipped with a semiconductor substrate 2, the ferroelectric capacitor 3 formed on the semiconductor substrate 2, and a switching transistor (hereafter referred to as a transistor) 4 for the ferroelectric capacitor 3, as shown in FIG. 1.

The semiconductor substrate 2 is composed of, for example, silicon (Si), and an interlayer dielectric film 5 composed of silicon dioxide ($SiO_2$) or the like is formed on its top surface side. In the interlayer dielectric film 5A is provided a contact hole 5A that penetrates the interlayer dielectric film 5 at a region corresponding to a second impurity region layer 24 to be described below, and a plug 6 is embedded in the contact hole 5A.

The plug 6 is formed from a conductive material filled in the contact hole 5A, and may be composed of, for example, tungsten (W), molybdenum (Mo), tantalum (Ta), titanium (Ti), nickel (Ni) or the like. In the present embodiment, the plug 6 is composed of W.

The ferroelectric capacitor 3 is equipped with a base layer 11 formed on the interlayer dielectric film 5 and the plug 6, a lower electrode 12 laminated on the base layer 11, a ferroelectric film 13 laminated on the lower electrode 12, and an upper electrode 14 laminated on the ferroelectric film 13.

The base layer 11 is equipped with a conductive film 15 conductively connected to the plug 6, and a barrier layer 16 laminated on the conductive film 15.

The conductive film 15 may be composed of, for example, titanium nitride (TiN). As titanium nitride includes Ti that excels in self-orientating characteristic, the conductive film 15 also has good crystal orientation characteristic on the plug 6 in particular, and therefore functions to improve the crystal orientation characteristic of each layer formed above the conductive film 15.

The barrier layer 16 is composed of material containing crystalline, and having conductivity and oxygen barrier property, and may be composed of, for example, TiAlN, TiAl, TiSiN, TiN, TaN, TaSiN or the like. In the present embodiment, the barrier layer 16 is formed from TiAlN.

The lower electrode 12 is composed of, for example, at least one of iridium (Ir), platinum (Pt), ruthenium (Ru), rhodium (Rh), palladium (Pd), osmium (Os), or an alloy or an oxide of any of the foregoing materials. The lower electrode 12 may preferably be composed of Ir or Pt, and more preferably Ir. It is noted that the lower electrode 12 may be in a single layer film or a multilayer film of laminated layers.

When the lower electrode 12 contains any crystalline material, the lower electrode and the barrier layer 16 preferably have crystal orientations in the epitaxial growth direction at the interface where the crystal orientations of the lower electrode and the barrier layer contact each other. In this case, the lower electrode 12 and the ferroelectric film 13 also preferably have crystal orientations in the epitaxial growth direction at the interface where they contact each other.

For example, when the barrier layer 16 belongs to a cubic system and has the crystal orientation (111), or belongs to a hexagonal system and has the crystal orientation (001), the lower electrode 12 preferably has the crystal orientation (111). In this configuration, it is easier for the ferroelectric layer 13 to have the crystal orientation (111) when forming the ferroelectric layer 13 on the lower electrode 12.

The ferroelectric film 13 is formed from a first ferroelectric layer 13a, a second ferroelectric layer 13b and a third ferroelectric layer 13c laminated in this order from the side of the lower electrode 12.

The first ferroelectric layer 13a is composed of ferroelectric material having a perovskite type crystal structure expressed by a general formula $ABO_3$, and is formed by a metal organic chemical vapor deposition method (MOCVD method) as described below. In the general formula, the element A is composed of Pb, or an element in which a part of Pb is replaced with La. Also, the element B may be composed of at least one of Zr and Ti, or both of Zr and Ti. As the ferroelectric material composing the first ferroelectric layer 13a, any of known ferroelectric materials, such as, for example, PZT (lead zirconate titanate), SBT, and $(Bi, La)_4Ti_3O_{12}$ (bismuth lanthanum titanate: BLT) may be used. Above all, PZT is preferably used. Accordingly, the first ferroelectric layer 13a in the present embodiment is composed of PZT.

Furthermore, when PZT is used as the ferroelectric material, the lower electrode 12 may preferably be made of iridium (Ir) from the viewpoint of reliability of the ferroelectric capacitor 3.

As PZT to be used, the content of Ti in PZT is preferably more than that of Zr to acquire a greater amount of spontaneous polarization. When the content of Ti in PZT is greater than the content of Zr, the hysteresis characteristic is improved.

The second ferroelectric layer 13b is composed of ferroelectric material in which a part of a B site element in ferroelectric material having a perovskite type crystal structure expressed by a general formula $ABO_3$ is replaced with Nb. In the present embodiment, the second ferroelectric layer 13b is composed of ferroelectric material (PZTN) in which a part of titanium (Ti) or zirconium (Zr) in lead zirconate titanate (PZT) is replaced with niobate (Nb). The ratio (element ratio) of Nb in the B site element may preferably be 10% or more but 50% or less of the total amount of the elements Ti, Zr and Nb.

When Nb is included by 10% or more in element ratio, the PZTN can sufficiently exhibit the effect of reducing leakage current. Also, the PZTN tends to have a smaller inversion charge (Qsw) as the B site element is replaced with Nb. However, when Nb is 50% or less in element ratio, deterioration in the ferroelectric characteristic that may be caused by the reduction in the inversion charge (Qsw) can be suppressed. It is noted that the second ferroelectric layer 13b may be formed by a sputter method or a sol-gel method.

The third ferroelectric layer 13c is composed of ferroelectric material having a perovskite type crystal structure expressed by a general formula $ABO_3$, like the first ferroelectric layer 13a, and is composed of PZT that is the same as that of the first ferroelectric layer 13a in accordance with the present embodiment. However, unlike the first ferroelectric layer 13a, the third ferroelectric layer 13c is formed by a sol-gel method, as described below.

The ferroelectric film 13 formed in the three-layer structure has an overall thickness of about 120 nm-130 nm. The thickness of the second ferroelectric layer 13b and the third ferroelectric layer 13c combined is about one fourth (¼) of the entire thickness of the ferroelectric film 13, and more specifically about 20 nm to about 50 nm. Also, the thickness of the second ferroelectric layer 13b is about one third (⅓) of the thickness of the second ferroelectric layer 13b and the third ferroelectric layer 13c combined, and more specifically about 10 nm to about 15 nm. The thickness of the second ferroelectric layer 13b is made to be about 10 nm to about 15 nm because it may be difficult to form a uniform favorable film if the thickness is less than 10 nm, and there is a possibility that the effect of reducing leakage current may not be sufficiently achieved. On the other hand, when the thickness exceeds 15 nm, there is a possibility that the overall ferroelectric characteristic of the ferroelectric film 13 may be deteriorated because the inversion charge (Qsw) of PZTN composing the second ferroelectric layer 13b is small as described above.

The upper electrode 14 may be made of the same material as that of the lower electrode 12 described above, or made of aluminum (Al), silver (Ag), nickel (Ni), or the like. The upper electrode 14 may be either a single layer film or a multilayer film of laminated layers. In particular, the upper electrode 14 may preferably be formed from a multilayer film of platinum or iridium oxide and iridium layers.

The transistor 4 is equipped with a gate dielectric layer 21 formed in a portion of the surface of the semiconductor substrate 2, a gate conductive layer 22 formed on the gate dielectric layer 21, first and second impurity region layers 23 and 24 which are source and drain regions, respectively, formed in the surface layer of the semiconductor substrate 2. The transistor 4 is conductively connected to the lower electrode 12 of the ferroelectric capacitor 3 through the plug 6 formed on the second impurity region layer 24. Also, a plurality of transistors 4 may be formed at intervals on the semiconductor substrate 2, and element isolation regions 25 are formed between adjacent ones of the transistors 4 to isolate and insulate the transistors 4 from one another.

Next, based on the method for manufacturing the ferroelectric memory device 1 described above, a method for manufacturing a ferroelectric capacitor in accordance with an embodiment of the invention is described with reference to FIGS. 2 and 3. FIGS. 2A-2E, and 3A-3E are schematic cross-sectional views showing the steps of the method for manufacturing a ferroelectric memory device.

Figure 2A:
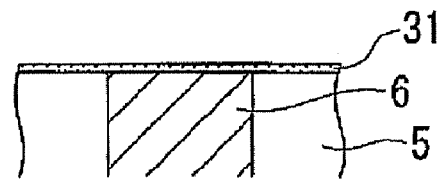
FIGS. 2A-2E are schematic cross-sectional view showing steps of a method for manufacturing the ferroelectric memory device shown in FIG. 1.
Figure 2B:
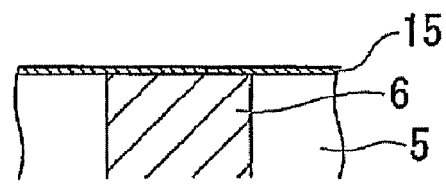

First, first and second impurity region layers 23 and 24 are formed in a surface layer of a semiconductor substrate 2, and a transistor 4 and an interlayer dielectric film 5 are formed on the semiconductor substrate 2, according to an ordinary method. Then, as shown in FIG. 2A, a contact hole 5A is formed in the interlayer dielectric film 5, and a conductive material, such as, tungsten (W) is filled in the contact hole 5A, thereby forming a plug 6.

Next, a base layer 11 is formed on the interlayer dielectric film 5 and the plug 6. First, a base forming layer 31 composed of Ti is formed on the interlayer dielectric film 5 and the plug 6. As the method for forming the base forming layer 31, for example, a sputter method may be used. Titanium, which composes the base forming layer 31, has generally high self-orientation characteristic, and therefore forms a layer having a hexagonal close-packed structure with crystal orientation (001) when deposited into a film by a sputter method. Accordingly, the base forming layer 31 exhibits the crystal orientation (001) because of its self-orientation characteristic. Then, a nitriding treatment is applied to the base forming layer 31 to change the base forming layer 31 into a conductive layer 15. Here, rapid thermal anneal process (RTA process) is applied to the base forming layer 31 at about 500° C. to 650° C. in a nitrogen atmosphere, thereby nitriding the base forming layer 31. Heat treatment temperatures lower than 650° C. would suppress deteriorating effects on the characteristics of the transistor 4, and heat treatment temperatures higher than 500° C. would shorten the nitriding treatment. The formed conductive film 15 is composed of titanium nitride (TiN) with crystal orientation (111), reflecting the orientation of the original metal Ti.

Figure 2C:
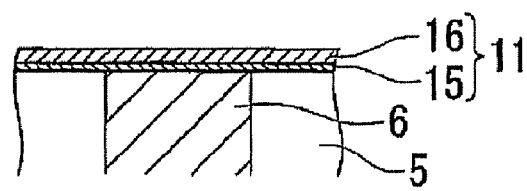

Then, as shown in FIG. 2C, a barrier layer 16 composed of TiAlN is formed on the conductive film 15, thereby forming a base layer 11 composed of the conductive film 15 and the barrier layer 16. In forming the barrier layer 16, the lattice structure of the conductive film 15 and the lattice structure of the barrier layer 16 are made to match each other at the interface between the conductive film 15 and the barrier layer 16 to be formed, whereby the barrier layer 16 is formed epitaxial-like on the conductive film 16. By this, the barrier layer 16 having the crystal orientation (111), which reflects the crystal orientation (111) of the conductive film 15, is formed. In this instance, as the barrier layer 16 is composed of TiAlN having crystalline as described above, the barrier layer 16 can be oriented to a plane orientation (111). The method of forming the barrier layer 16 may be selected as needed depending on the material composing the barrier layer 16, and for example, a sputtering method may be used.

Next, a lower electrode 12 is formed on the barrier layer 16. In accordance with the present embodiment, the lower electrode 12 is formed in two steps including forming an electrode film and forming an electrode oxide film.

Figure 2D:
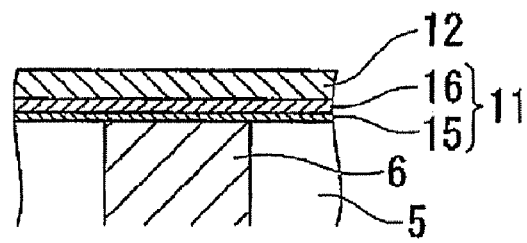

First, the electrode film is formed. In this step, as shown in FIG. 2D, a film of iridium (Ir) is formed by a sputter method on the barrier layer 16 having crystalline, thereby forming the lower electrode 12. By forming the lower electrode 12 in this manner, the crystallinity of the lower electrode 12 becomes favorable, and the crystal orientation of the barrier layer 16 is reflected in the lower electrode 12, whereby the lower electrode 12 has crystal orientation (111), which is the same as the barrier layer 16.

Figure 2E:
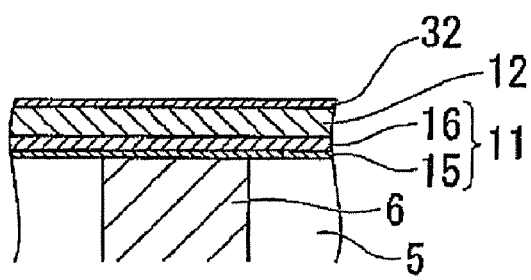

Then, the electrode oxide film is formed. Here, a film of Ir, which is the material composing the lower electrode 12, is formed by a sputter method while supplying oxygen gas onto the lower electrode 12. By this, as shown in FIG. 2E, an electrode oxide film 32 composed of iridium oxide ($IrO_2$) is formed on the lower electrode 12 in a thickness, for example, between 20 nm and 30 nm. The electrode oxide film 32, which is formed by a sputter method, is formed with a uniform film thickness.

The film formation using a sputter method enables the electrode oxide film 32 to be formed at lower temperatures, compared to a thermal oxidation method, such that thermal impacts that may be inflicted on other components that have preliminary been formed, such as, the transistor 4, can be reduced. Also, the ratio of oxygen gas supplied in the chamber at the time of film formation by sputtering may preferably be about 30% in mole ratio in a mixed gas of the oxygen gas and other gas to be supplied with the oxygen gas such as an inert gas. By this, the electrode oxide film 32 that is sufficiently oxidized can be formed. It is noted that the ratio of oxygen gas at the time of film formation by sputtering may be set between 20% and 40%.

Then, a first ferroelectric layer 13a is formed on the electrode oxide film 32. In accordance with the present embodiment, the first ferroelectric layer 13a is formed in two steps of forming a lower layer and forming an upper layer.

Figure 3A:
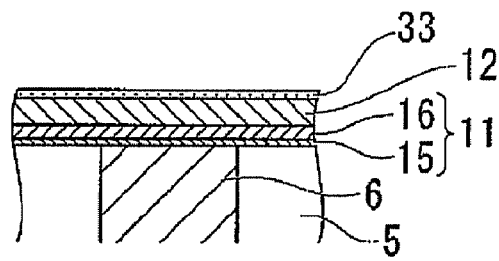
FIGS. 3A-3E are schematic cross-sectional view showing steps of the method for manufacturing the ferroelectric memory device shown in FIG. 1.

First, as shown in FIG. 3A, a lower layer 33 of the first ferroelectric layer 13a is formed. In this step, the lower layer 33 is formed by a MOCVD method while supplying a mixed gas of organometallic source material vapor and oxygen gas onto the electrode oxide film 32 which is placed within a chamber (reaction chamber). As the organometallic source material vapor, for example, Pb (DIBM) [Pb $(C_9H_{15}O_2)_2$: lead bis(diisobutyl methanate)], Zr (DIBM) [Zr $(C_9H_{15}O_2)_2$: zirconium (diisobutyl methanate)], and Ti $(Oi Pr)_2$ $(DPM)_2$ [Ti $(O-i-C_3H_7)_2$ $(C_{11}H_{19}O_2)_2$: titanium (diisopropoxy)(dipivaloylmethanate)] are used. As the organometallic source material vapor, other materials, such as, Pb $(DPM)_2$ [Pb $(C_{11}H_{19}O_2)_2$: lead (dipivaloylmethanate)], Zr $(IBPM)_4$ [Zr $(C_{10}H_{17}O_2)_2$: zirconium tetrakis (isobutyl pivaloylmethanate)], and Ti $(Oi Pr)_2$ $(DPM)_2$ may be used.

The organometallic source material vapor supplied inside the chamber reacts with oxygen gas, thereby being decomposed and oxidized, and is deposited on the electrode oxide film 32 as crystallized PZT. In this manner, the lower layer 33 of the first ferroelectric layer 13a is formed on the electrode oxide film 32.

In this instance, the flow amount of oxygen gas to be supplied in the chamber is made smaller than the amount of oxygen necessary for completely reacting with the organometallic source material vapor. For example, the flow amount of oxygen gas may be 0.33 times the amount of oxygen necessary for reacting with the total amount of the organometallic source material vapor supplied. It is noted that, in the present embodiment, the amount of oxygen necessary for reacting with the organometallic source material vapor is the sum of the amount of oxygen required for burning carbon and hydrogen originated from materials of the organometallic source material vapor and releasing them as $CO_2$ (carbon dioxide) and $H_2O$ (water), and the amount of oxygen required for crystallizing ferroelectric materials composing the ferroelectric layer.

Therefore, as the necessary amount of oxygen for reaction is not supplied, the organometallic source material vapor, while depriving oxygen from $IrO_2$ composing the electrode oxide film 32, is broken down and oxidized, thereby becoming crystallized PZT and being deposited on the electrode oxide film 32 as the lower layer 33.

On the other hand, the electrode oxide film 32 is reduced when oxygen in $IrO_2$ is deprived, thereby becoming to have the same composition as that of the lower electrode 12 composed of Ir, and integrated with the lower electrode 12. In this instance, the crystal orientation of the integrated lower electrode 12 is directed to the (111) orientation. By this, the lower layer 33 has the same crystal orientation as that of the lower electrode 12 which is in the crystal orientation (111).

It is noted that the film thickness of the electrode oxide film 32 may be made to 20 nm or more but 30 nm or less, whereby the electrode oxide film 32 transmits the surface structure ((111) orientation) of the lower electrode 12 to the lower layer 33, and the lower layer 33 becomes to have the same crystal orientation as that of the lower electrode 12, which is the crystal orientation (111).

Furthermore, as the ratio of oxygen gas is set, at the time of forming the electrode oxide film 32, at 20% or more but 40% or less, the electrode oxide film 32 is prevented from being plentifully oxidized and becoming a near-metallic state, and the surface structure (orientation characteristic) of the lower electrode 12 (Ir) disposed therebelow is prevented from becoming impossible to be transmitted to the lower layer 33 due to excessive oxidation.

Figure 3B:
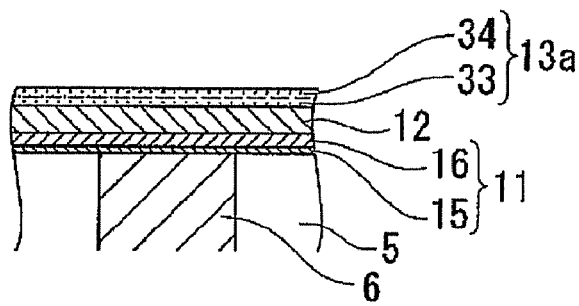

Next, as shown in FIG. 3B, an upper layer 34 is formed on the lower layer 33. In this step, the upper layer 34 is formed on the lower layer 33 by using a MOCVD method, like the step of forming the lower layer 33 described above.

In this instance, the flow amount of oxygen gas to be supplied in the chamber is made greater than the amount of oxygen necessary for reacting with the organometallic source material vapor. For example, the amount of oxygen is 6.77 times the amount of oxygen necessary for reacting with the total amount of the organometallic source material vapor supplied.

As a result, the organometallic source material vapor, while reacting with the supplied oxygen gas, is broken down and oxidized, thereby becoming crystallized PZT and being deposited on the lower layer 33, whereby the upper layer 34 is formed. The upper layer 34 is controlled to have the crystal orientation (111), as the lower layer 33 having the crystal orientation (111) acts as a core. Also, by forming the upper layer 34 in an atmosphere containing an ample supply of oxygen, the upper layer 34 can be formed with high quality and few oxygen deficiencies. By the steps described above, the first ferroelectric layer 13a composed of the lower layer 33 and the upper layer 34 and having the crystal orientation (111) is formed.

Figure 3C:
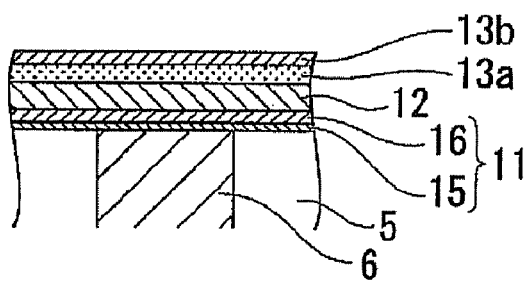

Then, a second ferroelectric layer 13b is formed on the first ferroelectric layer 13a, as shown in FIG. 3C. For forming the second ferroelectric layer 13b, a film of PZTN is formed on the first ferroelectric layer 13a by a sputter method or a sol-gel method. In the case of forming the film by a sputter method, for example, a target containing Pb, Zr, Ti and Nb in a preliminarily set element ratio is prepared, and sputtering is conducted with the target while supplying an appropriate amount of oxygen, whereby the second ferroelectric layer 13b composed of PZTN of desired compositions is formed.

Also, in the case of forming the film by a sol-gel method, as the sol-gel solution, a mixed solution containing, for example, a sol-gel solution for $PbZrO_3$, a sol-gel solution for $PbTiO_3$ and a sol-gel solution for $PbNbO_3$ mixed at a predetermined ratio may be used. Alternatively, a mixed solution containing a solution such as an alkoxide containing Pb, a solution such as an alkoxide containing Zr, a solution such as an alkoxide containing Ti and a solution such as an alkoxide containing Nb mixed at a predetermined ratio may be used. The mixed solution is coated on the first ferroelectric layer 13a by a spin coat method or the like. Then, a heat treatment (RTA treatment) is conducted in an oxygen atmosphere in the temperature range between 550° C. and 650° C. to sinter the layer of the mixed solution, thereby forming the second ferroelectric layer 13b composed of PZTN of desired compositions.

Compositions of the second ferroelectric layer 13b, more specifically, compositions of Ti, Zr and Nb at the B site may appropriately be adjusted, such that the lattice constant of the second ferroelectric layer 13b matches with the lattice constant of the first ferroelectric layer 13a. In other words, the compositions of Ti, Zr and Nb at the B site of the second ferroelectric layer 13b may preferably be adjusted such that their peaks in X-ray diffractometry appear at the same positions as the peaks of PZT (111) composing the first ferroelectric layer 13a. As a result, the lattice constants of the PZT composing the first ferroelectric layer 13a and the PZTN composing the second ferroelectric layer 13b can be matched each other, and a third ferroelectric layer 13c that is to be formed on the second ferroelectric layer 13b can be readily made to have the same crystal orientation as the crystal orientation (111) of the first ferroelectric layer 13a.

Figure 3D:
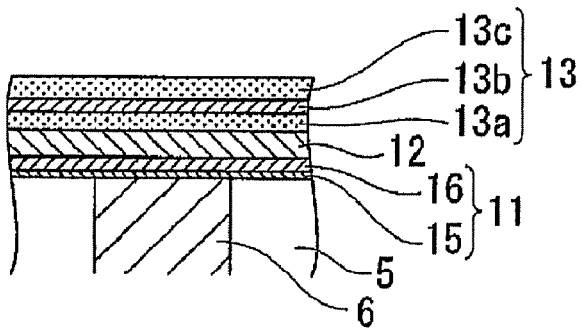

Next, as shown in FIG. 3D, a third ferroelectric layer 13c is formed on the second ferroelectric layer 13b. For forming the third ferroelectric layer 13c, a film of PZT is formed on the second ferroelectric layer 13b by a sol-gel method. According to the sol-gel method, as the sol-gel solution, a mixed solution containing, for example, a sol-gel solution for $PbZrO_3$ and a sol-gel solution for $PbTiO_3$ mixed at a predetermined ratio may be used. Alternatively, a mixed solution containing a solution such as an alkoxide containing Pb, a solution such as an alkoxide containing Zr, and a solution such as an alkoxide containing Ti mixed at a predetermined ratio may be used. The mixed solution is coated on the second ferroelectric layer 13b by a spin coat method or the like. Then, a heat treatment (RTA treatment) is conducted in an oxygen atmosphere in the temperature range between 550° C. and 650° C. to sinter the layer of the mixed solution, thereby forming the third ferroelectric layer 13c composed of PZT of desired compositions. As a result, the ferroelectric film 13 formed from a laminate of the first ferroelectric layer 13a, the second ferroelectric layer 13b and the third ferroelectric layer 13c is obtained.

By forming the third ferroelectric layer 13c by a sol-gel method in a manner described above, even when roughness (morphology roughness) is formed in the surface of the first ferroelectric layer 13a formed by a MOCVD method, the surface of the obtained ferroelectric film 13 is flattened by the third ferroelectric layer 13c.

Figure 3E:
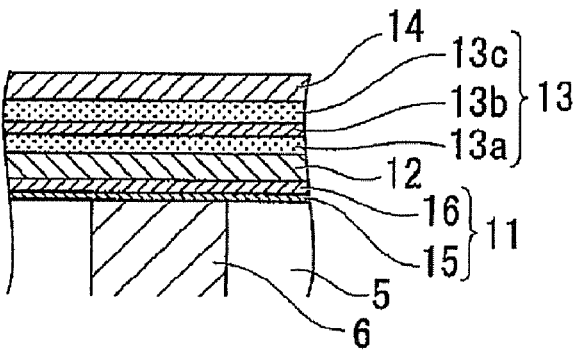

Then, as shown in FIG. 3E, an upper electrode 14 is formed on the ferroelectric film 13. As the method for forming the upper electrode 14, any method may be appropriately selected according to the material composing the upper electrode 14, and for example, a sputter method may be used.

Then, a resist layer is formed on the upper electrode 14, exposed and developed, and then patterned into a specified shape to obtain a resist pattern. By using the resist pattern as a mask, the base layer 11, the lower electrode 12, the ferroelectric film 13 and the upper electrode 14 are etched, whereby a ferroelectric capacitor 3, shown in FIG. 1, is obtained. Furthermore, an interlayer dielectric film and the like (not shown) that cover the ferroelectric capacitor 3 are formed, whereby a ferroelectric memory device 1 is obtained.

With the ferroelectric capacitor 3 in the ferroelectric memory device 1 thus obtained, even when roughness (morphology roughness) is formed in the surface of the first ferroelectric layer 13a formed by a MOCVD method, the surface of the obtained ferroelectric film 13 is flattened because the third ferroelectric layer 13c is formed by a sol-gel method. As a result, leakage currents that may be caused by morphology roughness can be reduced.

Furthermore, the second ferroelectric layer 13b composed of PZTN with few leakage current is formed between the first ferroelectric layer 13a and the third ferroelectric layer 13c, such that current leakage paths at the interface between the first ferroelectric layer 13a formed by a MOCVD method and the third ferroelectric layer 13c formed by a sol-gel method are embedded by the second ferroelectric layer 13b, whereby leakage currents are reduced.

Also, because the first ferroelectric layer 13a is formed by a MOCVD method, the second ferroelectric layer 13b and the third ferroelectric layer 13c formed on the first ferroelectric layer 13a have excellent crystal orientation, like the first ferroelectric layer 13*a*, as the crystal orientation characteristic of their respective base layer is reflected in each of the layers. Therefore the entire ferroelectric film 13 has favorable crystal orientation, whereby the characteristic of ferroelectric capacitor 3 having the ferroelectric film 13 is further improved. Also, according to the method for manufacturing such a ferroelectric capacitor 3, the characteristic of the obtained ferroelectric capacitor 3 can be made more favorable.

It is noted that the invention is not limited to the embodiments described above, and many changes can be made without departing from the subject matter of the invention. For example, a dielectric hydrogen barrier composed of alumina ($Al_2O_3$) or the like that covers the side and upper surfaces of the ferroelectric capacitor 3 may be provided.

What is claimed is:

1. A ferroelectric capacitor comprising:
   a ferroelectric film; and
   a first electrode and a second electrode sandwiching the ferroelectric film, the ferroelectric film including:
      a first ferroelectric layer of a first simple perovskite type oxide formed by a metal organic chemical vapor deposition method;
      a second ferroelectric layer of a second simple perovskite type oxide, atoms of a B-site of the second simple perovskite type oxide including Nb; and
      a third ferroelectric layer of a third simple perovskite type oxide formed by a sol-gel method,
      the first electrode, the first ferroelectric layer, the second ferroelectric layer, and the second electrode being laminated in this order.

2. A ferroelectric capacitor according to claim 1, wherein a ratio of a number of Nb to a number of the atoms of the B-site of the second simple perovskite type oxide is 10 to 50%.

3. The ferroelectric capacitor according to claim 1, wherein the first simple perovskite type oxide includes lead zirconate titanate, the second ferroelectric layer includes lead zirconate titanate niobate, and the third ferroelectric layer includes lead zirconate titanate.

4. A method for manufacturing a ferroelectric capacitor comprising:
   forming a first ferroelectric layer of a first simple perovskite type oxide on a first electrode by a metal organic chemical vapor deposition method;
   forming a second ferroelectric layer of a second simple perovskite type oxide on the first ferroelectric layer, atoms of a B-site of the second simple perovskite type oxide including Nb; and
   forming a third ferroelectric layer of a third simple perovskite type oxide on the second ferroelectric layer by a sol-gel method.

* * * * *